United States Patent [19]

Torbet

[11] 4,241,104
[45] Dec. 23, 1980

[54] PROCESS FOR BONDING CARBON SUBSTRATES USING PARTICLES OF A THERMALLY STABLE SOLID

[75] Inventor: Christopher J. Torbet, Ann Arbor, Mich.

[73] Assignee: The Fluorocarbon Company, Anaheim, Calif.

[21] Appl. No.: 951,333

[22] Filed: Oct. 16, 1978

[51] Int. Cl.$^2$ .............................................. C23C 11/00
[52] U.S. Cl. ................................. 427/113; 156/283; 156/344; 427/203; 427/249; 427/419.7; 428/408
[58] Field of Search ............... 156/283, 344; 428/408; 427/249, 419 F, 113, 203

[56] References Cited

U.S. PATENT DOCUMENTS

| | | | |
|---|---|---|---|
| 2,979,814 | 4/1961 | Steinberg | 428/408 |
| 3,138,435 | 6/1964 | Diefendorf | 427/249 |
| 3,399,969 | 9/1968 | Bokros et al. | 427/249 |
| 3,442,617 | 5/1969 | Turkat et al. | 427/249 |
| 3,547,676 | 12/1970 | Bokros et al. | 427/249 |
| 3,549,847 | 12/1970 | Clark | 428/408 |
| 3,666,526 | 5/1972 | Ettinger et al. | 427/249 |
| 3,725,110 | 4/1973 | Rodgers et al. | 427/249 |
| 3,852,107 | 12/1974 | Lorkin et al. | 427/113 |
| 3,900,540 | 8/1975 | Robba et al. | 423/458 |
| 3,927,186 | 12/1975 | Vinton et al. | 423/447 |
| 3,944,686 | 3/1976 | Froberg | 427/249 |
| 4,022,875 | 5/1977 | Vinton et al. | 423/445 |
| 4,048,953 | 9/1977 | Froberg | 118/49 |
| 4,067,956 | 1/1978 | Franklin et al. | 423/445 |

FOREIGN PATENT DOCUMENTS

| | | | |
|---|---|---|---|
| 744260 | 7/1970 | Belgium | 428/408 |
| 929465 | 6/1963 | United Kingdom | 428/408 |
| 302856 | 5/1977 | U.S.S.R. | 428/408 |

OTHER PUBLICATIONS

Knippenberg et al., "Carbon Foam" Phillips Technical Revue vol. 36, pp. 93–103, 1976.

*Primary Examiner*—John D. Smith
*Attorney, Agent, or Firm*—Knobbe, Martens

[57] ABSTRACT

An improved process for providing a bond between carbon substrates using particles of a thermally stable solid is described. In particular, a laminate of a porous carbon substrate and a relatively non-porous carbon substrate using finely divided particles of a thermally stable solid which are in contact with and between both substrates is heated in the presence of a carbonizable gas, such as methane, in a chamber such that the gas contacts the carbon substrates and the particles so that a mutual coating of pyrolytic carbon is deposited on the exposed surfaces of all components and bonds them together. More than two carbon substrates can be bonded using the particles as interlayers between the substrates. The pyrolytic carbon coated composite products are particularly useful as electrodes.

11 Claims, No Drawings

PROCESS FOR BONDING CARBON SUBSTRATES USING PARTICLES OF A THERMALLY STABLE SOLID

BACKGROUND OF THE INVENTION

The present invention relates to a process for providing a bonded composite product by the deposition of a coating of pyrolytic carbon on the exposed surfaces of a laminate including at least one porous carbon substrate and particles of a thermally stable solid and which contains a relatively less porous carbon substrate also in contact with the particles. In particular, the present invention relates to the use of a carbonizable gas which contacts the heated laminate so that pyrolytic carbon coating deposits on the laminate surfaces to produce bonding.

PRIOR ART

U.S. Pat. Nos. 3,927,186; 4,022,875 and 4,067,956, assigned to applicant's assignee, describe open, porous carbon structures in the form of reticulate or foam interconnected strand structures and processes for their preparation. These carbon structures, particularly the vitreous carbon structures, are particularly useful as open, porous carbon substrates used as starting materials for the present invention. The porous carbon structures have between about 8 and 120 pores per inch (PPI).

The reason for the preference for the carbon products of U.S. Pat. Nos. 3,927,186; 4,022,875 and 4,067,956 is their uniform and substantially crack-free structures and the ease of rapidly heating these carbon structures without producing cracks. There are, however, numerous other processes for preparing open, porous carbon structures in the prior art. The carbon structures preferably have interconnected strands, however, they can be in the form of bats or mats of disconnected carbon fibers which are also known.

U.S. Pat. Nos. 3,138,435; 3,399,969; 3,442,617; 3,547,676; 3,549,847; 3,666,526; 3,851,048; 3,900,540; 3,944,686 and 4,048,953 describe processes for depositing a pyrolytic carbon coating. The deposition of pyrolytic carbon in the form of a graphite coating on an open, porous reticulated vitreous carbon substrate has also been suggested in Phillips Technical Revue, Vol. 36 pp 93 to 103, Nov. 4, 1976.

The problem with these prior art processes is to provide a composite product which is prepared from laminae of two or more different carbon substrates where one substrate is very porous. Generally the prior art has not attempted to form such composite products.

OBJECTS

It is therefore an object of the present invention to provide an improved process for forming a bonded composite product including multiple carbon substrates at least one of which is very porous. This and other objects will become increasingly apparent by reference to the following description.

GENERAL DESCRIPTION

The present invention relates to the process for bonding an open porous carbon substrate to a less porous carbon substrate using finely divided particles of a thermally stable solid to form a composite product which comprises: providing finely divided particles of a thermally stable solid in contact with both an open porous carbon substrate, and a less porous carbon substrate; providing the composite in a confined chamber such that there is a carbonizable gas in contact with the particles and substrates; and heating the carbon substrates and the particles in the presence of a carbonizable gas which decomposes at elevated temperatures to pyrolytic carbon so that a coating of the pyrolytic carbon is deposited on the surfaces of the carbon substrates and on the particles, thereby bonding the carbon substrates and particles together to form a composite product. It has been found that by the process of the present invention, a pyrolytic carbon coating is firmly adhered to the surfaces of the carbon substrates andto the particles so that unexpectedly an excellent bond is achieved in the composite product. The bond appears to be primarily mechanical because of the pyrolytic carbon coating which "locks" into and around the substrates and particles. The bond between the carbon substrates is very poor if the particles are omitted.

The finely divided particles which are used for the present invention are essentially inert at the temperatures and in relation to the other process conditions used to coat pyrolytic carbon on the laminate. These temperatures are preferably between 1000° C. and 2500° C. Within this limitation, carbon particles are preferred, such as graphite powder of vitreous carbon powder, since the pyrolytic carbon coating bonds well to these particles. Other particles which can be used and the various borides and nitrides such as tungsten carbide and boron nitride. The particles preferably are 40 and finer U.S. mesh (ASTM E-11-61). The particles must be large enough to leave channels between the particles for the carbonizable gas to penetrate and must also surround the strands or struts forming the porous carbon substrate sufficiently to produce bonding.

The second carbon substrate can be porous or non-porous, so long as the pyrolytic carbon will bond to it, such as a graphite sheet. A second substrate can be used merely as a scaffold which is removed after the deposition of the pyrolytic carbon such that the particles are bonded to the porous carbon substrate alone.

Generally the decomposition temperature for the carbonizable gases are between about 1000° C. to 2,500° C., with 1000° C. to 2,200° C. being preferred. Included as carbonizable gases are hydrocarbons, particularly lower aliphatic hydrocarbons containing 1 to 10 carbon atoms. Saturated hydrocarbons particularly lower alkanes such as methane, ethane and propane are especially preferred.

The carbonizable gas can be diluted with gases such as hydrogen, argon and nitrogen and the process can be performed at atmospheric pressure or less. The flow rate is low enough to provide a substantially uniform coating of the pyrolytic carbon on the carbon substrates and particles. Usually there is at least about 20 minutes of heating in the carbonizable gas to provide a significant coating the pyrolytic carbon for bonding. The coating process can continue to the desired thickness so long as there is bonding. The carbon substrates can be placed on a belt in the chamber moving across or perpendicular to the gas flow direction in a continuous process as is known to those skilled in the art. The carbonizable gas is usually not introduced to the chamber until the desired deposition temperature has been reached in the composite.

The pyrolytic carbon coated structures are preferably cooled in the presence of a non-reactive or a reducing gaseous atmosphere after deposition of the pyrolytic carbon. The decomposable gas can be used as a neutral atmosphere. Alternatively a gas such as nitrogen or rare gases which are essentially non-reactive can be used.

SPECIFIC DESCRIPTION

The following is a description of the preferred process for bonding by depositing pyrolytic carbon. A piece of a reticulated vitreous carbon structure as described in U.S. Pat. No. 3,927,186 was used. A layer of carbon powder was placed on a graphite sheet as a second carbon substrate and then the retriculated vitreous carbon was embedded in the powder to a depth of about 2 to 3 mm. The laminate was placed inside a chamber or retort for firing. The retort containing the laminate was placed in a heated muffle furnace at 700° C. and then the temperature was increased to 1000° C. The retort was first flushed with nitrogen and then with bottled natural gas and flowed through the retort at a rate of about 4 cubic feet per hour (31.48 cubic cm per second). The exiting carbonizable gas residues were burned. After a period of about 5 to 6 hours, the natural gas flow was stopped. The retort was again flushed with nitrogen, and then the retort containing the composite product with the pyrolytic carbon coated on the laminate was removed from the furnace to cool. The color of the composite product turned from the deep glassy black of the reticulated vitreous carbon structures to a dark silver.

The following are specific Examples of the process of the present invention.

EXAMPLE 1

A reticulated porous vitreous carbon sheet as described in U.S. Pat. No. 3,927,186 and a graphite plate were bonded together. An 8"×9"×1" thick sheet of 45 PPI porous carbon substrate was provided. A 4½"×4½"×¼" thick sheet of graphite was crushed into the surface of the porous sheet to provide for good mating of the surfaces then the crushed particles were removed. It is contemplated that the particles from crushing do not require removal and can be used as the bonding particles. It is a characteristic of those porous carbons that they can be shaped by crushing. Fine graphite powder was sprinkled on the surface of the graphite plate to a depth of about 2 to 3 mm. The two pieces were placed together with the particles between the sheets and embedded around the surface struts of the porous carbon substrate and then placed in a retort after which a lid was placed on the retort. The retort had a gas inlet in one corner. Three ¼" holes were provided in the top edge farthest away from the inlet tube to provide an outlet for the gas. The lid of the retort was sealed using a sand seal. The sealed retort containing the sample was then placed in a 700° C. furnance with a 4 cubic feet per hour flow of methane through it. The temperature was raised to 1000° C. and held for 6 hours. Then the retort was removed from the furnace and kepth under a nitrogen atmosphere until cool and the laminate was removed from the retort. The color of the sample had changed from black to silver. The graphite plate was firmly bonded to the porous carbon. The strands of the foam were initially immersed in the soft graphite powder and as a result of the pyrolytic carbon deposition the graphite powder became a solid mass thus trapping the strands.

EXAMPLE 2

The process of Example 1 were repeated except that crushing the graphite plate into the foam was not used, but rather both pieces were flat on the surfaces to be bonded. A piece of 100 PPI porous carbon substrate as described in U.S. Pat. No. 3,927,186 measuring 10"×10"×1/10" thick and a piece of 21"×16"×¼" thick graphite plate was used. Vitreous carbon powder which was 200 U.S. mesh was sprinkled on the graphite plate to a depth of about 1 to 2 mm. The 100 PPI porous carbon substrate was then placed on the graphite plate so the porous carbon struts or strands were embedded in the powder. The excess powder around the outside of the porous carbon was then brushed off. The laminate was then placed in a room temperature vacuum furnace and the furnace was evacuated. The temperature of the furnace was raised to 2,200° C. at which time a diluted methane in nitrogen mixture containing 20% methane was provided at 10 mm mercury absolute pressure for 20 minutes; after which the furnace was again evacuated and allowed to cool. Upon removed from the furnace the porous carbon was securely bonded to the graphite plate. This laminate was fabricated into a zinc-bromine battery and performed successfully as a bromine electrode.

Resistance heating can be used to heat the laminate for the process although it is not preferred. Other forms of heating, such as microwave or induction heating can also be used.

The products of the present invention are particularly useful as electrodes as well as for other electrical applications where a foraminous conductive material is required. They can also be used in high temperature insulation applications.

I claim:

1. The process for bonding carbon substrates using finely divided particles of a thermally stable solid to form a composite product which comprises:
    (a) providing finely divided particles of a thermally stable solid in contact with a pair of carbon substrates;
    (b) contacting said particles and substrates with a carbonizable gas; and
    (c) heating the carbon substrates and the particles in the presence of a carbonizable gas which decomposes at elevated temperatures to pyrolytic carbon so that a coating of the pyrolytic carbon is deposited on the surfaces of the carbon substrates and on the particles, thereby bonding the carbon substrates and particles together to form a composite product.

2. The process of claim 1 wherein the finely divided particles are carbon.

3. The process of claim 1 wherein the heating for depositing the coating of pyrolytic carbon is at a temperature of least about 1000° C.

4. The process of claim 1 wherein the heating for depositing the coating of pyrolytic carbon is at a temperature of up to about 2,500° C.

5. The process of claim 1 wherein the carbonizable gas is a lower aliphatic hydrocarbon containing 1 to 10 carbon atoms which decomposes to pyrolytic carbon.

6. The process of claim 1 wherein the porous carbon substrate is vitreous carbon with the interconnected strand structure in carbon of a reticulated polyurethane structure.

7. The process of claim 1 wherein the pyrolytic carbon coated carbon substrates and particles after heating in the presence of the carbonizable gas are cooled in a non-reactive gaseous atmosphere or vacuum.

8. The process of claim 7 wherein the non-reactive gaseous atmosphere is nitrogen.

9. The process of claim 1 wherein the carbonizable gas is flowed through the confined space at a rate of about 4 cubic feet per hour for 5.5 hours at about 1000° C.

10. The process of claim 1 wherein after a portion of the carbonizable gas is carbonized, remaining carbonizable gas and gaseous carbonization products are removed from the chamber and burned.

11. The process of claim 1 further comprising:
(d) removing one of the carbon substrates after the deposition of the pyrolytic carbon such that the particles remain bonded to the other carbon substrate.

* * * * *